(12) United States Patent
Wickeraad

(10) Patent No.: US 11,631,459 B2
(45) Date of Patent: Apr. 18, 2023

(54) DUAL COMPARE TERNARY CONTENT ADDRESSABLE MEMORY

(71) Applicant: HEWLETT PACKARD ENTERPRISE DEVELOPMENT LP, Houston, TX (US)

(72) Inventor: John Alan Wickeraad, Roseville, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 97 days.

(21) Appl. No.: 17/282,767

(22) PCT Filed: Oct. 30, 2018

(86) PCT No.: PCT/US2018/058099
§ 371 (c)(1),
(2) Date: Apr. 4, 2021

(87) PCT Pub. No.: WO2020/091735
PCT Pub. Date: May 7, 2020

(65) Prior Publication Data
US 2022/0013174 A1    Jan. 13, 2022

(51) Int. Cl.
*G11C 15/04* (2006.01)
*G11C 11/413* (2006.01)
(Continued)

(52) U.S. Cl.
CPC .............. *G11C 15/04* (2013.01); *G11C 15/00* (2013.01); *G11C 15/02* (2013.01);
(Continued)

(58) Field of Classification Search
CPC ... G11C 15/04; G11C 13/0004; G11C 13/003; G11C 13/0069; G11C 15/046;
(Continued)

(56) References Cited

U.S. PATENT DOCUMENTS 5,319,590 A    6/1994   Montoye
7,095,640 B2 *  8/2006   Ma ........................ G11C 15/04
                                                365/207

(Continued)

OTHER PUBLICATIONS

Patwary, A. R. et al., "Low-power Ternary Content Addressable Memory (TCAM) Array for Network Applications," IEEE, Sep. 18, 2009, https://ieeexplore.ieee.org/stamp/stamp.jsp?tp=&arnumber=5250516.

*Primary Examiner* — Ly D Pham
(74) *Attorney, Agent, or Firm* — Hewlett Packard Enterprise Patent Department

(57) ABSTRACT

A ternary content addressable memory (TCAM) semiconductor device includes a first and second data storage portions each connected to a bit line. The first data storage portion is connected to a first word line, and to a first and third group of in series transistors. The second data storage portion is connected to a second word line, and to a second and fourth group of in series transistors. The first group and second group of in series transistors are each connected to a first match line. The first group is connected to a first search line bar, and the second group is connected to a first search line. A third and fourth group of in series transistors are each connected to a second match line. The third group is connected to a second search line, and the fourth group is connected to a second search line bar.

13 Claims, 4 Drawing Sheets

(51) Int. Cl.
*G11C 11/417* (2006.01)
*G11C 11/00* (2006.01)
*G11C 15/00* (2006.01)
*G11C 7/00* (2006.01)
*G11C 15/02* (2006.01)
*G11C 11/4093* (2006.01)
*G11C 11/411* (2006.01)
*G11C 11/16* (2006.01)
*G11C 11/412* (2006.01)
*G11C 11/408* (2006.01)
*G11C 11/4097* (2006.01)

(52) U.S. Cl.
CPC ....... *G11C 11/1697* (2013.01); *G11C 11/4085* (2013.01); *G11C 11/4087* (2013.01); *G11C 11/4093* (2013.01); *G11C 11/4097* (2013.01); *G11C 11/411* (2013.01); *G11C 11/4125* (2013.01); *G11C 15/046* (2013.01)

(58) Field of Classification Search
CPC ........ G11C 16/0483; G11C 2013/0088; G11C 2013/0092; G11C 2213/75; G11C 15/00; G11C 15/043
USPC ...................................... 365/49.11
See application file for complete search history.

(56) References Cited

U.S. PATENT DOCUMENTS

| | | |
|---|---|---|
| 7,112,831 B2 * | 9/2006 | Kim .................... H01L 27/1052 |
| | | 257/E27.099 |
| 7,570,537 B2 | 8/2009 | Bhatia |
| 8,233,302 B2 | 7/2012 | Arsovski et al. |
| 8,553,441 B1 | 10/2013 | Argyres |
| 8,856,203 B1 | 10/2014 | Schelp et al. |
| 9,530,500 B2 | 12/2016 | Arsovski |
| 10,262,720 B2 | 4/2019 | Nii |
| 10,553,282 B2 * | 2/2020 | Darla ..................... G11C 15/04 |
| 2003/0058672 A1 * | 3/2003 | Aikawa ................. G11C 15/04 |
| | | 365/207 |
| 2007/0058407 A1 * | 3/2007 | Dosaka .................. G11C 15/04 |
| | | 365/189.15 |
| 2011/0134676 A1 * | 6/2011 | Breitwisch ......... G11C 13/0069 |
| | | 365/49.1 |
| 2013/0188409 A1 * | 7/2013 | Soyata .................. G11C 15/04 |
| | | 365/49.1 |
| 2014/0347906 A1 | 11/2014 | Menut et al. |
| 2016/0013190 A1 | 1/2016 | Liaw |
| 2017/0092359 A1 | 3/2017 | Louie et al. |
| 2018/0046689 A1 | 2/2018 | Yoshinaga |
| 2018/0068708 A1 | 3/2018 | Nii |

* cited by examiner

DUAL COMPARE TERNARY CONTENT ADDRESSABLE MEMORY

BACKGROUND

A CAM compares a search input with every word stored in memory. CAMs are especially useful for use in lookup tables, access control list (ACLs), quality of services (QOS), etc. As compared to static random access memory (SRAM), when an address is provided to an SRAM storage device, that address looks up a specific location of memory, and data may be accessed at that location. Rather than having an address of the data being located, a CAM uses a search variable and determines where the search key or data is stored in the CAM.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
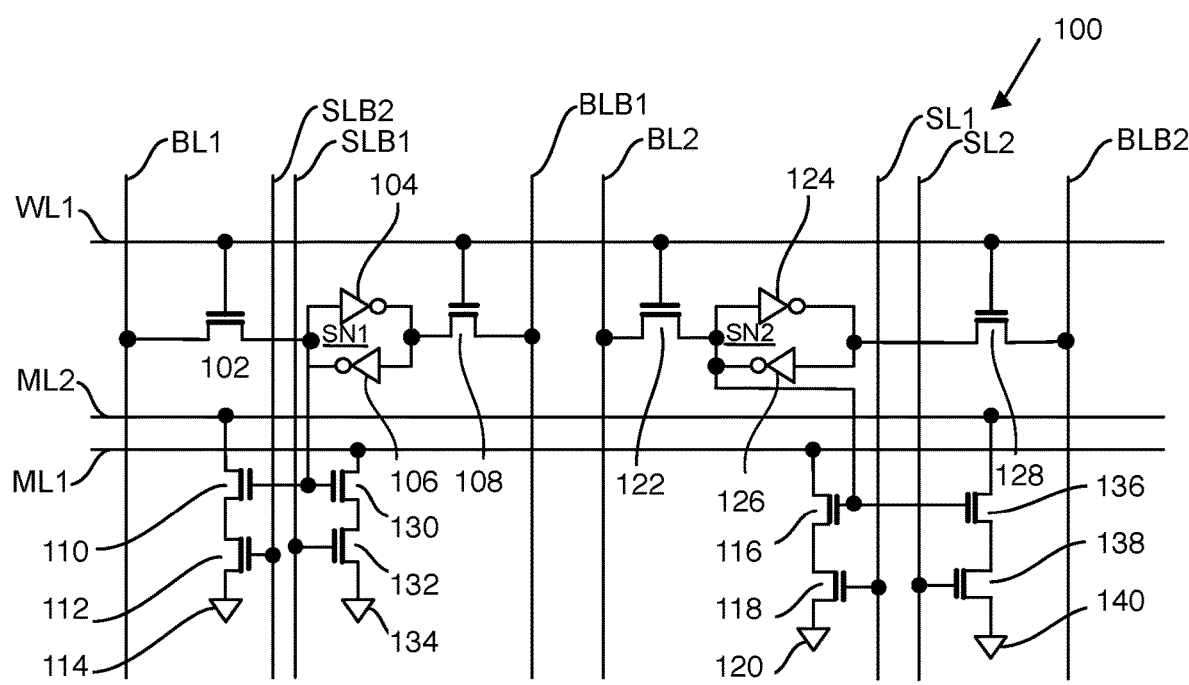
FIG. 1 illustrates a circuit diagram of an example ternary content addressable memory bitcell in a parallel configuration.

Often, however, a CAM is limited to searching for exact matches of data. This is not efficient or useful in certain applications.

A ternary content addressable memory (TCAM) further expands the search flexibility over the CAM. A significant difference between a CAM bitcell and TCAM bitcell is that not only may a TCAM bitcell utilize ones and zeros in a given entry to match, but the TCAM bitcell may be programmed to be a wildcard state (i.e. "I don't care what the data is.") Utilizing a TCAM bitcell, a search may be performed with relevant bits to match, and bits that are not material to the match (i.e, a wild card parameter). A TCAM with multiple TCAM bitcells allows storage of full data and a mask for any/all data bits, thus allowing combining many data entries into one storage entry. Each TCAM bitcell stores one of three data states, a logic "1", a logic "0", or a "don't care" value, in that the "don't care" value results in a match of the bit regardless of the value of the input bit of the search data. In order to encode three data states, each TCAM bitcell is configured to store two bits.

Current configurations of TCAM bitcells, however, incur inefficient search operation of data stored in a TCAM bitcell. Searches of data are typically executed by performing a single search against a TCAM bitcell per clock cycle. This limits processing speeds at which data may be looked-up and/or accessed.

Examples disclosed herein address these technical challenges by providing a ternary content addressable memory bitcell that includes two or more search circuits that search the same data stored in a storage node of a TCAM bitcell. Examples of the subject matter claimed below will now be disclosed. Some example TCAM bitcell disclosed herein are capable of being searched using two compare ports or circuits. Thus, the example TCAM bitcells disclosed herein provide greater efficiency in the number of search operations as compared to previous single search configurations. For example, TCAM bitcells disclosed herein may allow for two or more independent searches per clock cycle as to the same data stored in storage nodes of the TCAM bitcell. While the present disclosure is directed towards improved TCAM bitcell configurations, based on the disclosure, a CAM bitcell may be configured also to include two compare circuits as taught herein.

In the interest of clarity, not all features of an actual implementation are described in this specification. In the development of any such actual example, numerous implementation-specific decisions may be made to achieve the developer's specific goals, such as compliance with system-related and business-related constraints, which will vary from one implementation to another. Moreover, such a development effort, even if complex and time-consuming, would be a routine undertaking for those of ordinary skill in the art having the benefit of this disclosure.

Embodiments of the present disclosure are directed towards a ternary content addressable memory (TCAM) semiconductor device.

In a parallel memory cell configuration, the TCAM semiconductor bitcell includes a first and second data storage portion where the first and second data storage portions each include a transistor that is connected to the same word line. The first data storage portion includes a transistor that is connected to a first bit line and is connected to a first bit line bar. The second data storage portion each include a transistor that is connected to a second bit line and is connected to a second bit line bar. A first group and second group of in series transistors are each connected to the same first match line. The first group of in series transistors is connected to a first search line, and the second group of in series transistors is connected to a first search line bar. A third and fourth group of in series transistors are each connected to the same second match line. The third group of in series transistors is connected to a second search line bar, and the fourth group of in series transistors is connected to a second search line.

In a stacked memory cell configuration, the TCAM semiconductor bitcell includes a first and second data storage portion where the first and second data storage portions each include a transistor that is connected to the same bit line. The first data storage portion includes a transistor that is connected to a first word line, and the second data storage portion includes a transistor that is connected to a second word line. The first and second data storage portions each include a transistor that is connected to the same bit line bar. A first group and second group of in series transistors are each connected to the same first match line. The first group of in series transistors is connected to the same first search line bar, and the second group of in series transistors is connected to the same first search line. A third and fourth group of in series transistors are each connected to the same second match line. The third group of in series transistors is connected to the same second search line, and the fourth group of in series transistors is connected to the same second search line bar. The first data storage portion is connected to the first group and third group of in series transistors. The second data storage portion is connected to the second group and fourth group of in series transistors.

In another embodiment, a method of operating a ternary content addressable memory device (TCAM bitcell) includes receiving, by the TCAM bitcell, a first search criteria, the TCAM bitcell including a first and second storage portion, a first and second compare port, a first and second search line, a first and second search line bar, a first and second match line, and a word line; receiving, by the TCAM bitcell, a second search criteria; performing a first search of the first and second storage portion using the first compare port with the first search criteria; performing a second search of the first and second storage portion using the second compare port with the second search criteria; determining a first search output for the first search criteria; and determining a second search output for the second search criteria.

In other embodiments a method of operating a ternary content addressable memory device (TCAM bitcell) includes receiving, by the TCAM bitcell, a first search criteria, the TCAM bitcell including a first and second storage portion, a first and second compare port, a first and second search line, a first and second search line bar, a first and second match line, and a first and second word line; receiving, by the TCAM bitcell, a second search criteria; performing a first search of the first and second storage portion using the first compare port with the first search criteria; performing a second search of the first and second storage portion using the second compare port with the second search criteria; determining a first search output for the first search criteria; and determining a second search output for the second search criteria.

FIG. 1 illustrates a circuit diagram depicting an example ternary content addressable memory (TCAM) bitcell 100. This diagram depicts a parallel TCAM bitcell 100 which allows two compares per clock cycle. The TCAM bit cell 100 includes a first compare port having a first group of in series transistors 116, 118, and a second group of in series transistors 130, 132. The TCAM bitcell 100 includes a second compare port having a third group of in series transistors 110, 112, and a fourth group of in series transistors 136, 138.

The TCAM 100 includes one word line WL1, two match lines ML1, ML2, two bit lines BL1, BL2, two search lines SL1, SL2, two search line bars SLB1, SLB2 and two bit line bars BLB1, BLB2. Transistor 102 is connected to word line WL1 and bit line BL1. Transistor 108 is connected to bit line bar BLB1 and word line WL1. Transistor 122 is connected to bit line BL2, and to word line WL1. Transistor 128 is connected to word line WL1, and to bit line bar BLB2. Transistor 110 is connected to match line ML2. Transistor 112 is connected to transistor 110, and to search line bar SLB2, and to ground 114. Transistor 116 is connected to match line ML1. Transistor 118 is connected to transistor 116, search line SL1, and ground 120.

Transistor 130 is connected transistor 110, transistor 132, transistor 102, match line ML1, cross-coupled inverters 104 and 106. Transistor 132 is connected to transistor 130, search line SLB1, and to ground 134.

Transistor 136 is connected to transistor 116, transistor 138, match line ML2, cross-coupled inverters 124 and 126. Transistor 138 is connected to transistor 136, search line SL2, and to ground 140.

The TCAM bitcell 100 includes two storage portions. The first storage portion includes transistors 102, 108, and a first storage node SN1. The first storage node SN1 includes cross-coupled inverters 104, 106. Transistors 102 and 108 allow access to read or write a bit data value on the first storage node SN1, which in turn controls the state output by inverters 104 and 106. The second storage portion includes transistors 122, 128, and a second storage node SN2. The second storage node SN2 includes cross-coupled inverters 124, 126. Transistors 122 and 128 allow access to read or write the bit data value on the second storage node SN2, which in turn controls the state output by inverters 124 and 126. Inverter 104 is cross-coupled to inverter 106 such that the output terminal of inverter 104 is connected to the input terminal of inverter 106, and the output terminal of inverter 106 is connected to the input terminal of inverter 104. Inverter 124 is cross-coupled to inverter 126 such that the output terminal of inverter 124 is connected to the input terminal of inverter 126, and the output terminal of inverter 126 is connected to the input terminal of inverter 124. The output terminal of the inverters 104, 106, 124, 126 are represented in FIG. 1 by the lines extending from the circle of the inverter schematic. The input terminal of the inverters 104, 106, 124, 126 are represented by the line connected to the base of the triangle of the inverter schematic. The inverter 104 input terminal is connected to transistor 102, transistor 110, transistor 130 and to the output terminal of inverter 106. The output of inverter 104 is connected to transistor 108. The inverter 106 output terminal is connected to transistor 102, transistor 110, transistor 130 and to the input terminal of inverter 104. The input terminal of inverter 106 is connected to transistor 108. The inverter 124 input terminal is connected to transistor 122, transistor 116, transistor 136 and to the output terminal of inverter 126. The inverter 126 output terminal is connected to transistor 122, transistor 116, transistor 136 and to the input terminal of inverter 124. The inverter 126 input terminal is connected to transistor 128 and the output terminal of inverter 124.

Each storage node SN1, SN2 are used by the TCAM bitcell 100 to hold bit values of 0 or 1. A stored bit value of the first storage node SN1 may be independently determined by the first compare port or the second compare port. A stored bit value of the second storage node SN2 may be independently determined by the first compare port or the second compare port.

While the foregoing description of FIG. 1 describes a dual compare TCAM bitcell, the TCAM bitcell may be configured to include additional compare circuits. For example, a three compare port TCAM bitcell may be configured by adding four transistors, a third match line, a third search line bar, and a third search line.

Figure 2:
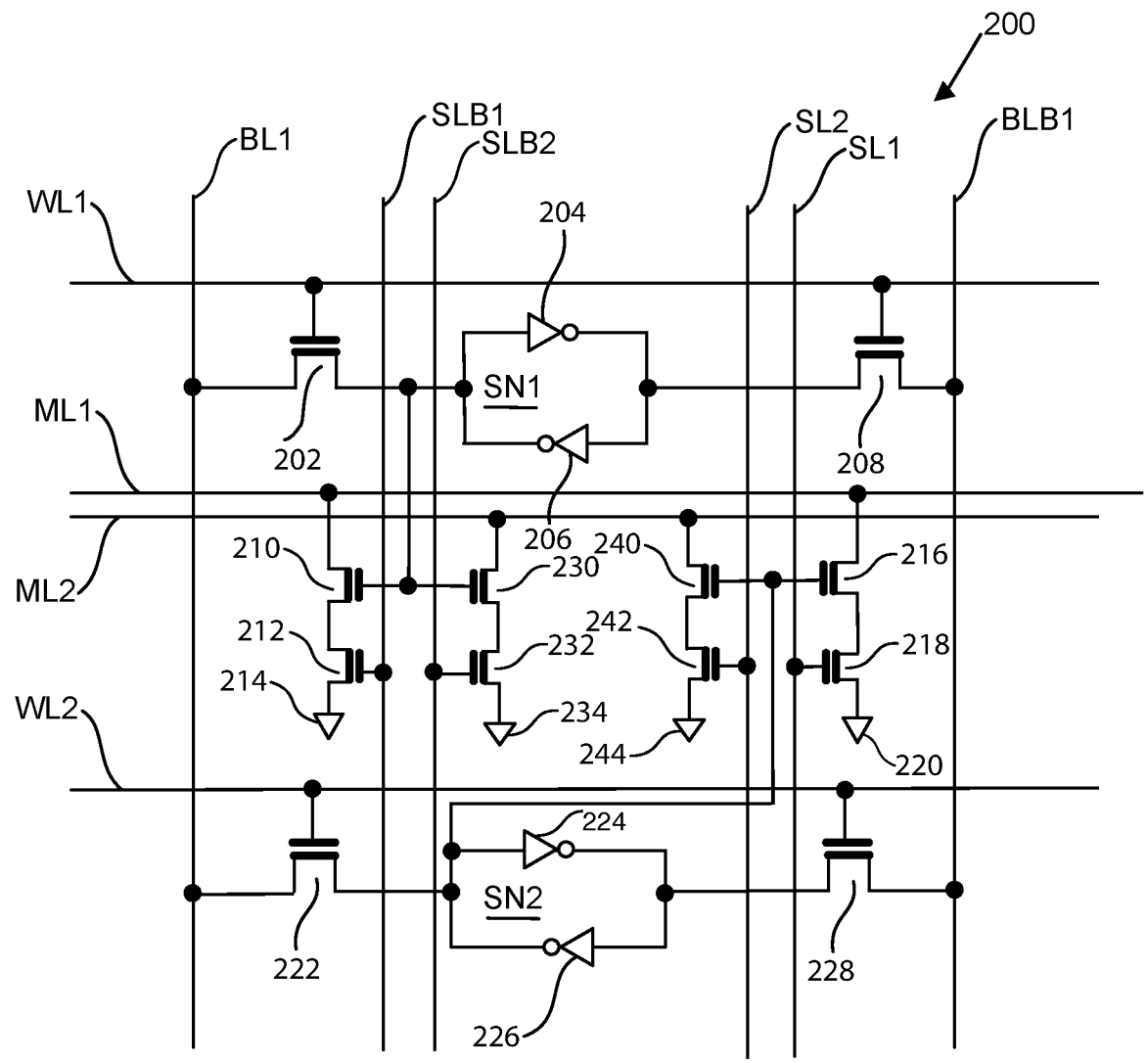
FIG. 2 illustrates a circuit diagram of an example dual compare ternary content addressable memory bitcell in a stacked configuration.

FIG. 2 illustrates a circuit diagram depicting an example ternary content addressable memory (TCAM) bitcell 200. The TCAM bit cell 200 includes a first compare port using a first group of in series transistors 210, 212, and a second group of in series transistors 216, 218. The bitcell 200 includes a second compare port using a third group of in series transistors 230, 232, and a fourth group of in series transistors 240, 242.

The TCAM bitcell 200 includes two word lines WL1, WL2, two match lines ML1, ML2, bit line BL1, two search lines SL1, SL2, two search line bars SLB1, SLB2 and bit line bar BLB1. Transistor 202 is connected to word line WL1 and bit line BL1. Transistor 208 is connected to bit line bar BLB1 and word line WL1. Transistor 222 is connected to bit line BL1, and to word line WL2. Transistor 228 is connected to word line WL2, and to bit line bar BLB1. Transistor 210 is connected to match line ML1. Transistor 212 is connected to transistor 210, to search line bar SLB1, and to ground 214. Transistor 216 is connected to match line ML1. Transistor 218 is connected to transistor 216, search line SL, and ground 220.

Transistor 230 is connected transistor 210, transistor 232, transistor 202, match ML2, cross-coupled inverters 204 and 206. Transistor 232 is connected to transistor 230, search line bar SLB2, and to ground 234.

Transistor 240 is connected to transistor 216, transistor 242, match line ML2, and cross-coupled inverters 224 and 226. Transistor 242 is connected to transistor 240, search line SL2, and to ground 244.

The TCAM bitcell 200 includes two storage portions. The first storage portion includes transistors 202, 208, and a first storage node SN1. The first storage node SN1 includes cross-coupled inverters 204, 206. Transistors 202 and 208 allow access to read or write a bit data value on the first storage node SN1, which in turn controls the state output by inverters 204 and 206. The second storage portion includes transistors 222, 228, and a second storage node SN2. The second storage node SN2 includes cross-coupled inverters 224, 226. Transistors 222 and 228 allow access to read or write the bit data value on the second storage node SN2, which in turn controls the state output by inverters 224 and 226. Inverter 204 is cross-coupled to inverter 206 such that the output terminal of inverter 204 is connected to the input terminal of inverter 206, and the output terminal of inverter 206 is connected to the input terminal of inverter 204. Inverter 224 is cross-coupled to inverter 226 such that the output terminal of inverter 224 is connected to the input terminal of inverter 226, and the output terminal of inverter 226 is connected to the input terminal of inverter 224. The output terminal of the inverters 204, 206, 224, 226 are represented in FIG. 2 by the lines extending from the circle of the inverter schematic. The input terminal of the inverters 204, 206, 224, 226 are represented by the line connected to the base of the triangle of the inverter schematic. The inverter 204 input terminal is connected to transistor 202, transistor 210, transistor 230 and to the output terminal of inverter 206. The output of inverter 204 is connected to transistor 208. The inverter 206 output terminal is connected to transistor 202, transistor 210, transistor 230 and to the input terminal of inverter 204. The input terminal of inverter 206 is connected to transistor 208. The inverter 224 input terminal is connected to transistor 222, transistor 216, transistor 240 and to the output terminal of inverter 226. The inverter 226 output terminal is connected to transistor 222, transistor 216, transistor 240 and to the input terminal of inverter 224. The inverter 226 input terminal is connected to transistor 228 and the output terminal of inverter 224.

Each storage node SN1, SN2 are used by the TCAM bitcell 200 to hold bit values of 0 or 1. A stored bit value of the first storage node SN1 may be independently determined by the first compare port or the second compare port. A stored bit value of the second storage node SN2 may be independently determined by the first compare port or the second compare port.

While the foregoing description of FIG. 2 describes a dual compare TCAM bitcell, the TCAM bitcell may be configured to include additional compare circuits. For example, adding four transistors, a third match line, a third search line and third search line bar a three compare circuit TCAM bitcell may be configured.

TCAM Operation

A TCAM is comprised of multiple TCAM bitcells 100, 200 that form an array of a number of TCAM entries each with a number of bitcells making up one entry. Each TCAM bitcell entry can contain a specific number of bitcells allowing a particular number of data bit values. For example, a TCAM may be formed with 512 stacked TCAM entries containing 144 TCAM bitcells thus allowing for a 144 bit wide search that would produce 512 matched lines out. The number of TCAM bitcells used for a TCAM may be adjusted for the particular search and implementation requirements.

The examples as disclosed herein (e.g., TCAM bitcells 100, 200) allow a TCAM to match multiple search strings. For example, a TCAM may include multiple TCAM bitcells 100, 200. Generally, TCAM search capability allows storage of full data/mask, thus collapsing many data entries into one entry. This typically allows multiple matches to be determined. The TCAM is particularly suited for routers, switches, core routers, or data center routers and switches where large TCAM tables are needed, and/or where high performance from packets per second may be required. Moreover, utilizing the TCAM bitcells 100, 200 described herein, a TCAM may increase its search efficiency by performing concurrent dual searches against the same data stored in a storage node of a TCAM bit cell.

A TCAM may be programmed to be a wildcard state ("I don't care what the data is"), and a search may be performed with relevant bits to match, and bits that are not material to the match. For example, a 32-bit wide TCAM entry could be configured to match on any number of bits from 0 to 32 and in any combination. If one wanted an entry to only match on the first 24 bits, the last 8 bits could be configured to an x (or don't care). In other words, where the last part of the entry is irrelevant (i.e., "I don't care" what the value may be), the search x acts as a wildcard for those data values. These x's allow collapsing of many entries within the route table which reduces the number of overall required entries, and allows collapsing of many different routes with multiple x's at the end of a route addresses into a single entry.

For example, a router may have a route table with entries that are in the form of 16 dot, 128 dot, 32 dot, x. An industry standard notation for this type of entry is 16.128.32.x or 16.128.32.0/24. This means only the first 24 bits have "cared" bits. In comparison, an entry of 16.128.32.0/22 would mean only the first 22 bits were "cared". Each of the numbers before the dot represents an 8 bit value (0-255). For example, to store an IPV4 route table, a TCAM would require enough bitcells to store 32 bits for each route entry instance, and for an IPV6 route table, the TCAM would require enough bitcells to store 64 bits for each route entry instance. The number of route instances needed would be dependent on the overall required routes for the specific application.

The TCAM bitcell 100, 200 includes two storage portions for storing data. The dual compare TCAM bitcell 100 described in FIG. 1 includes a first storage portion (transistors 102, 108, and a first storage node SN1 including cross-coupled inverters 104, 106), and a second storage portion (transistors 122, 128, and a second storage node SN2 including cross-coupled inverters 124, 126). The dual compare TCAM bitcell 200 described in FIG. 2 includes a first storage portion (transistors 202, 208, and a first storage node SN1 including cross-coupled inverters 204, 206), and a second storage portion (transistors 222, 228, and a second storage node SN2 including cross-coupled inverters 224, 226).

Each TCAM bitcell 100, 200 stores one of three data states, a logic "1", a logic "0", or a "don't care" value, in that the "don't care" value results in a match of the bit regardless of the value of the input bit of the search data. In order to encode three data states, each TCAM bitcell 100, 200 is configured to store two bits. The value of one bit is stored in a first storage node SN1, and the value of a second bit is stored in a second storage node SN2. For example, for a logic value of "0" the bit value of the first storage node SN1 may be set to 0, and the bit value of the second storage node may be set to 1. For a logic value of "1" the bit value of the first storage node SN1 may be set to 1, and the bit value of the second storage node may be set to 0. For a "don't care" value, the bit value of the first storage node SN1 may be set to 0, and the bit value of the second storage node SN2 may be set to 0. When a "don't care" value is stored in a bitcell, a match occurs for that bit regardless of the search data. A first storage node bit value of 1 and a second storage node bit value of 1 is typically undefined and is not used.

The storage nodes SN1, SN2 hold the values of bit data that is potentially being searched, either the value of 0 or the value of 1. The TCAM bitcell 100, 200 allows for data to be written to or read from the storage nodes SN1, SN2 of the TCAM bitcells 100, 200. The storage nodes are similar to how an SRAM is written and read. While the storage portions described herein are the form of an SRAM, the storage portions may be other configurations such as memristors or DRAMs.

The TCAM bitcell 100, 200 uses a bit line and bit line bar to read and write data into the storage nodes SN1, SN2. The dual compare TCAM bitcell 100 as described in FIG. 1 includes a first bit line BL and a first bit line bar BLB1 pair, and second bit line BL2 and second bit line bar BLB2 pair. The dual compare TCAM bitcell 200 as described in FIG. 2 includes bit line BL1 and bit line bar BLB1. The difference between the parallel configuration of FIG. 1 and the stacked configuration of FIG. 2 is how the circuitry reads and writes data to a storage node SN1, SN2 of the TCAM bitcell 100, 200. In the parallel configuration, the TCAM bitcell 100 can read or write to both storage nodes SN1, SN2 of the TCAM bitcell at the same time during one computer processing unit (CPU) cycle. The parallel configuration of FIG. 1 would be used to read from (or write to) both storage nodes in the same CPU cycle. In the stacked configuration of FIG. 2, the TCAM bitcell 200 takes one CPU cycle to perform a read or a write to one of the storage nodes SN1, SN2 and takes two cycles to read or write to both storage nodes SN1, SN2. Typical implementation of the TCAM bitcell would include a write to both storage nodes or read to both storage nodes in a given CPU cycle. While possible to perform a write to one storage node and perform a read to the other storage node, this is not a typical implementation of a TCAM bitcell. In some examples, the stacked configuration of FIG. 2 may be chosen for use instead of the parallel configuration of FIG. 1 because the parallel configuration uses more power than the stacked configuration for compare operations. The increased power is due to the increased length (capacitance) of the match lines ML1, ML2.

The bit line and bit line bar are used to read and write into a storage node SN1, SN2. The bit line bar is the inversion of the bit line. When writing data to a data storage node SN1, SN2 of the TCAM bitcell 100, 200, the respective bit line and bit line bar are driven to opposite values, for example a high voltage and low voltage to write a bit value of 1 to a storage node SN1, SN2. When reading data from a storage node SN1, SN2 of the TCAM bitcell 200, the bit line BL1 and bit line bar BLB1 are both pre-charged with a high voltage, and then either the bit line BL1 or bit line bar BLB1 would be discharged via transistor 202 or transistor 208 depending on the value stored in cross-coupled inverters 204, 206.

The TCAM bitcell 100, 200 uses one or two word lines, respectively. The dual compare TCAM bitcell 100 as described in FIG. 1 includes a word line WL1. The dual compare TCAM bitcell 200 as described in FIG. 2 includes a first word line WL1 and a second word line WL2. The word lines are used for either reading or writing to a data storage node SN1, SN2 of the TCAM bitcell.

With regard to the TCAM bitcell 100 of FIG. 1, for reading the first and second storage nodes SN1, SN2 an electronic signal is generated to activate word line WL1. Depending on the stored bit value of the first storage node SN1, either the first bit line BL1 or the first bit line bar BLB1 would be pulled to a low voltage, and the other would remain at a high voltage. And depending on the stored bit value of the second storage node SN2, either the second bit line BL2 or the second bit line bar BLB2 would be pulled to a low voltage, and the other would remain at a high voltage.

With regard to the TCAM bitcell 200 of FIG. 2, for reading storage node SN1, an electronic signal is generated to activate word line WL1 and either one of the first bit line BL1 and the first bit line bar BLB1 would be pulled to a low voltage, and the other would remain at a high voltage. Similarly, for reading storage node SN2, an electronic signal is generated to activate the second word line WL2 and either one of the first bit line BL1 and the first bit line bar BLB1 would be pulled to a low voltage, and the other would remain at a high voltage.

With regard to TCAM bitcell 100 of FIG. 1, for writing to storage node SN1, SN2, the first bit line BL1 and bit line bar BLB1 are driven to opposite values, and the value on the first bit line BL1 would be written into the storage node SN1 when an electronic signal is generated to activate the first word line WL1, the second bit line BL2 and the second bit line bar BLB2 are also driven to opposite values, and the value on the second bit line BL2 would be written into the storage portion SN2 when an electronic signal is generated to activate the first word line WL1.

With regard to TCAM bitcell 200 of FIG. 2, for writing to storage node SN1, SN2, the first bit line BL1 and bit line bar BLB1 are driven to opposite values, and the value on the first bit line BL1 would be written into the storage node SN1 when an electronic signal is generated to activate the first word line WL1. For writing to storage node SN2, the first bit line BL and first bit line bar BLB1 are also driven to opposite values, and the value on the first bit line BL1 would be written into the storage node SN2 when an electronic signal is generated to activate the second word line WL2.

The TCAM bitcell 100, 200 may perform two independent compares to determine a match for the value of 0, 1 or x (i.e., a wildcard of "don't_care") as to the data values stored in the first and second storage nodes SN1 and SN2. The dual compare TCAM bitcell 100, 200 uses two search lines SL1, SL2 and two search line bars SLB1, SLB2. The dual compare TCAM bitcell 100 as described in FIG. 1 includes a first search line SL1 and first search line bar SLB1, and a second search line SL2 and a second search line bar SLB2. The dual compare TCAM bitcell 200 as described in FIG. 2 includes a first search line SL1 and a first search line bar SLB1, and a second search line SL2 and a second search line bar SLB2.

The dual compare TCAM bitcell 100, 200 also includes two match lines ML1, ML2. The dual compare TCAM bitcell 100 as described in FIG. 1 includes a first match line ML1 and a second match line ML2. The dual compare TCAM bitcell 200 as described in FIG. 2 includes first match line ML1 and a second match line ML2.

A search cycle may be divided into a pre-charge phase and a search phase. In the pre-charge phase, the first match line ML1 and the second match line ML2 of the TCAM bitcells 100, 200 are both pre-charged to a high voltage, and the search lines SL1, SL2 are driven to ground (i.e., to a low voltage). For the search phase, the respective search line and search line bars SL1, SLB1 and SL2, SLB2 are driven to opposite voltage values (one a higher voltage and one a lower voltage as compared to one another) depending on whether searching for a 0 or a 1 as to the data values stored in the first and second storage nodes SN1 and SN2. For example, for a first search when searching for a value of 0, the first search line SL1 would be driven to a low voltage, and the first search line bar SLB1 would be driven to a high voltage. And when searching for a value of 1, the first search line SL1 would be driven to a high voltage, and the first search line bar SLB1 would be driven to a low voltage. For the second search when searching for a value of 0, the second search line SL2 would be driven to a low voltage, and the second search line bar SLB2 would be driven to a high voltage. And when searching for a value of 1, the second search line SL2 would be driven to a high voltage, and the second search line bar SLB2 would be driven to a low voltage.

If the respective search "does not care" or does not need to determine the value of the storage nodes SN1, SN2, both the search line and the search line bar may be set to a low voltage. For example, if the first search "does not care" about the data values stored in the first and second storage nodes SN1, SN2, then both the first search line SL1, and the first search line bar SLB1 may be driven to a low voltage. If the second search "does not care" about the data values stored in the first and second storage nodes SN1, SN2, then both the second search line SL2, and the second search line bar SLB2 may be driven to a low voltage. Setting both a search line and corresponding search line bar to a low voltage acts as a global wildcard mask (i.e., "don't care" about the data values in the first or second storage nodes SN1, SN2) for the respective search.

For a dual search the match line ML1, search line SL1 and search line bar SLB1 are used together, and match line ML2, search line SL2 and search line bar SLB2 are used together. Each of ML1, SL1 and SLB1 are independent of ML2, SL2, and SLB2. In other words, each of ML1, SL1 and SLB1 and ML2, SL2, and SLB2 may be used to perform independent searches for two different search criteria (i.e., search values 0, 1 or x—"don't care") against the same data stored in the first and second storage nodes SN1, SN2 of the TCAM bitcells 100, 200. To add additional search functionality, additional N match lines, search lines and search line bars may be added to the TCAM bitcell 100, 200.

The search lines SL1 and SL2 can both be driven to different voltage values and may perform two different independent searches. For example, the first search line SL1 may search for the value of 1, and the second search line SL2 may search for a value of 2. The result of two independent searches may be determined based on the voltage value of the match line ML1 and match line ML2. For example, the result of the each of the two independent searches would respectively be indicated on match lines ML1 and ML2. If a match line is not pulled down to a low voltage, then there is a match for the search criteria. In other words, the match line would retain a high charge when there is a match for the search criteria. If there is a mismatch, then the respective in series transistors would be turned on and would discharge a respective match line ML1, ML2 indicating there is a mismatch for the searched criteria. As to TCAM bitcell 100, the in series transistors 130, 132 and the in series transistors 116, 118 are used in conjunction with the first match ML1. The in series transistors 110, 112 and the in series transistors 136, 138 are used in conjunction with the second match line ML2. As to TCAM bit cell 200, the in series transistors 210, 212 and the in series transistors 216, 218 are used in conjunction with the first match ML1. The in series transistors 210, 212 and the in series transistors 236, 238 are used in conjunction with the second match line ML2.

Figure 3:
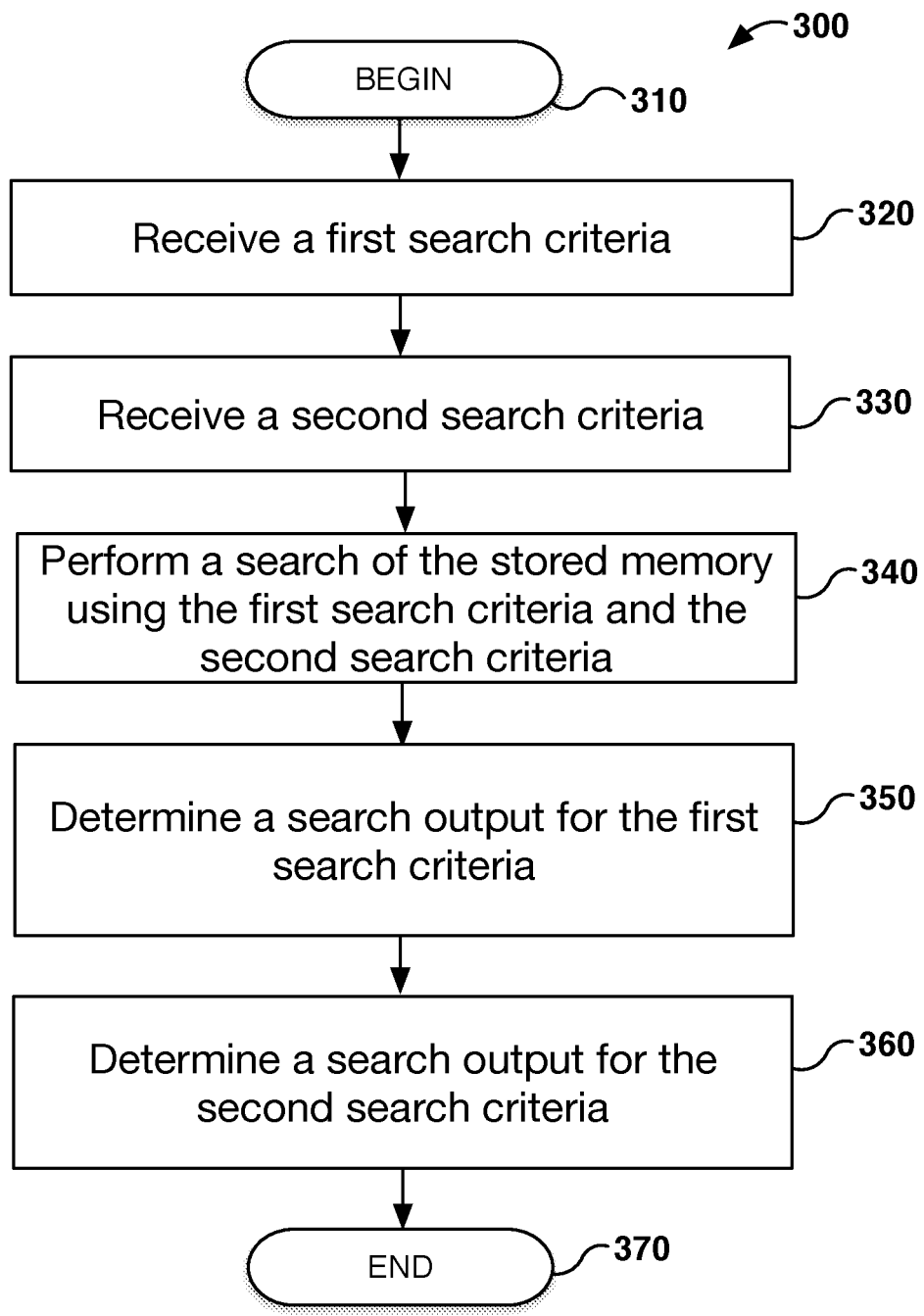
FIG. 3 illustrates a flow chart of an example dual compare process of a ternary content addressable memory.

Discussion is now turned to the dual search process of the example TCAM bitcells 100, 200 described in FIGS. 2 and 1. FIG. 3 illustrates a flow chart of an example dual search process 300 of a ternary content addressable memory.

The dual search process begins 310 and the TCAM bitcells 100, 200 receives a first search criteria 320, and a second search criteria 330. The first and second search criteria may be provided from another circuit, a memory register, or from other memory (such as SDRAM) to the TCAM. The search criteria is typically a value of 0 or value of 1.

The TCAM bitcell 100, 200 performs a search 340 of the data stored in the first storage node and second storage nodes SN1, SN2 using the first search criteria and the second search criteria. The search is performed by comparing the search criteria to the data values stored in the storage nodes SN1, SN2. The dual search port TCAM allows for the concurrent searching of data stored in the TCAM bitcell. In other words, the dual port TCAM bitcell provides for two search ports (also referred to as channels) against the same data stored the first and second storage nodes SN1, SN2 of the TCAM bitcell 100, 200. The dual search may be performed during a single central processing unit (CPU) clock cycle.

The TCAM bitcell 100, 200 determines a search output for the first search criteria 350 and determines a search output for the second search criteria 360. The process then ends 370. The search output may be provided to another circuit, may be stored in a memory register or may be stored in other data storage (such as SDRAM). The search output may be in the form in the form of data indicative of a match or mismatch of the search criteria. For example, if the search criteria is found in the TCAM the search output may be a value of 1 for true, or if not found than may be a value of 0 for false. Most TCAMs will be used in situation where there are many entries that may indicate a match. Many searches will result in multiple matches due to search criteria where the search does not care about the stored values in a TCAM bit cell, and the match indicators are sent into a priority encoder to determine highest priority match and encode into an address.

For example, with reference to FIG. 2, the match lines ML1 and ML2 in a pre-charge phase, are charged with a high voltage before a compare begins. The search lines SL1 and SL2 are charged pre-charged to ground. A first search word (i.e., a first search criteria), and a second search word (i.e., a second search criteria) are received from some data register. A search line driver encodes the first and second search words onto the search lines SL1, SL2 and search line bars SLB1, SLB2, which are then charged as '1' or '0' (from the pre-charge to ground). The dual search circuitry compares the first search word and the second search word against the same data stored in the TCAM bitcell 200. If there is a match between the search word and a stored word there is no conduction path from corresponding match line to ground and the match line voltage remains high. But if there is a single mismatch, the match voltage discharges to 0. A single bit mismatch will pull down the match line and the result is 0 volts out (i.e., no match). If there is a "don't care" entry in the cell there will always be a match for this bitcell (i.e. the match lines would not be pulled down by this bitcell).

Figure 4:
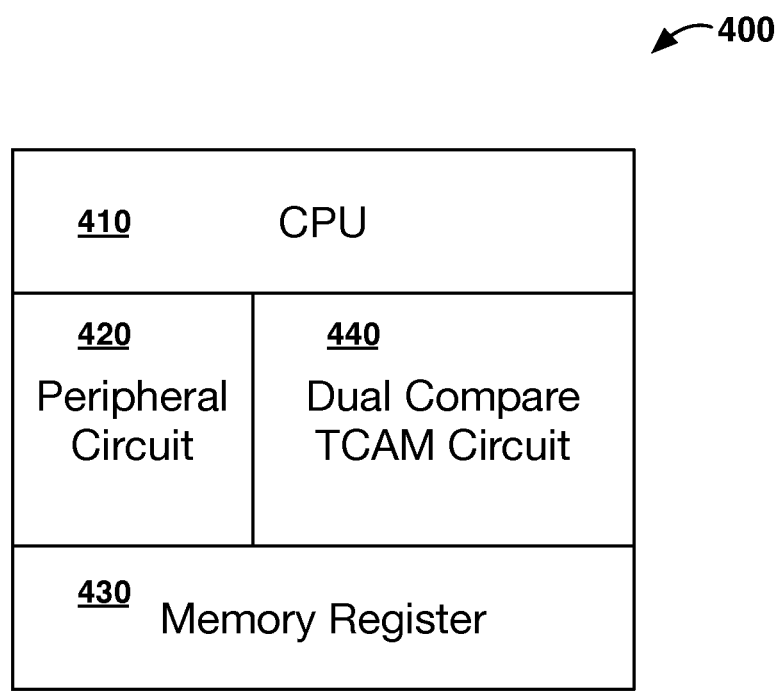
FIG. 4 illustrates a block diagram of an example implementation of dual compare ternary content addressable memory.

FIG. 4 illustrates a block diagram of an example implementation of dual compare ternary content addressable memory in an application specific integrated circuit (ASIC) 400. Application specific integrated circuit (ASIC) 400 may include a central processing unit 410, peripheral circuitry 420, a memory register 430 and a dual compare TCAM circuit 440 as described herein. While the example ASIC is shown as an integrated circuit, the dual compare TCAM circuit 440 may be configured as a separate ASIC with or without additional circuitry. For example, the TCAM circuit 440 may be configured as a switch ASIC for use in router table compares to determine packet distribution paths.

The example TCAM bitcells are described herein and illustrated in the drawings in a conceptual or schematic manner to aid understanding. In particular, physical structures in the example TCAM bitcells are referred to and/or illustrated conceptually herein as circuit components, and the relationships between these circuit components are illustrated in circuit diagrams in accordance with the usual practice in the art. Circuit components are conceptual representations of classes of physical structures or devices that perform certain functions and/or have certain properties. Examples of such circuit components include passive devices such as resistors, capacitors, memristors, etc.; active devices such as transistors, diodes, etc.; constituent elements of the active/passive devices such as terminals, electrodes, gates, sources, drains, etc.; elements that connect devices such as wiring lines, nodes, etc.; and so on.

It should be understood that a single physical structure (or set of physical structures) in an actual physical incarnation of an example TCAM bitcells may serve multiple functions and/or have multiple properties, and thus a single physical structure (or set of physical structures) may be described and/or illustrated herein as multiple distinct circuit components. For example, a single piece of metal in a particular physical incarnation of an example TCAM bitcells may serve as both a gate electrode of a transistor and as a wiring line. Thus, the fact that two or more circuit components may be referred to or illustrated herein as distinct components should not be interpreted to mean that their corresponding physical structures in a physical incarnation of the example TCAM bitcells are distinct structures.

When reference is made herein or in the appended claims to a first component being "connected between" or "connected to" a second and third component, this means that two opposing terminals of the first component are connected to the second component and to the third component, respectively. In particular, when reference is made herein or in the appended claims to a transistor being "connected between" or "connected to" two elements, this means that a source terminal of the transistor (also referred to as a source electrode, source region, source, etc.) is connected to one of the two elements, and a drain terminal of the transistor (also referred to as a drain electrode, drain region, drain, etc.) is connected to the other one of the two elements.

The foregoing description, for purposes of explanation, used specific nomenclature to provide a thorough understanding of the disclosure. However, it will be apparent to one skilled in the art that the specific details are not required to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

I claim:

1. A semiconductor device comprising:
   a first data storage portion;
   a second data storage portion;
   the first and second data storage portions each connected to a bit line;
   the first data storage portion connected to a first word line;
   the second data storage portion connected to a second word line;
   a first group of in series transistors connected to a first match line;
   a second group of in series transistors connected to the first match line;
   the first group of in series transistors connected to a first search line bar; and
   the second group of in series transistors connected to a first search line;
   a third group of in series transistors connected to a second match line;
   a fourth group of in series transistors connected to the second match line;
   the third group of in series transistors connected to a second search line;
   the fourth group of in series transistors connected to a second search line bar;
   the first data storage portion connected to the first group and third group of in series transistors; and
   the second data storage portion connected to the second group and fourth group of in series transistors.

2. The semiconductor device of claim 1, wherein each of the first and second data storage portions comprise an electronic circuit including a first and second cross-coupled inverter, and a first and second transistor, wherein an output of the first cross-coupled inverter is connected to the first transistor and is connected to an input of the second cross-coupled inverter, and an output of the second cross-coupled inverter is connected to the second transistor and is connected to an input of the first cross-coupled inverter.

3. The semiconductor device of claim 1, wherein the first data storage portion and the second data storage portion are each connected to a bit line bar.

4. The semiconductor device of claim 1, wherein each of the group of in series transistors is connected to ground.

5. The semiconductor device of claim 1, wherein the first group of in series transistors is connected to the second group of in series transistors; and
   the third group of in series transistors is connected to the fourth group of in series transistors.

6. The semiconductor device of claim 1, further comprising:
   a third data storage portion;
   a fourth data storage portion;
   the third and fourth data storage portions each connected to a second bit line;
   the third data storage portion connected to the first word line; and
   the fourth data storage portion connected to a second word line.

7. The semiconductor device of claim 6, wherein each of the third and fourth data storage portions comprise an electronic circuit including a third and fourth cross-coupled inverter, and a third and fourth transistor, wherein an output of the third cross-coupled inverter is connected to the third transistor and is connected to an input of the fourth cross-coupled inverter, and an output of the fourth cross-coupled inverter is connected to the fourth transistor and is connected to an input of the third cross-coupled inverter.

8. The semiconductor device of claim 6, wherein the third data storage portion and the fourth data storage portion are each connected to a second bit line bar.

9. A method of operating a ternary content addressable memory device (TCAM), the method comprising:
- receiving, by the TCAM, a first search criteria, the TCAM including a first and second storage portion, a first and second compare port, a first and second search line, a first and second search line bar, a first and second match line, and a first and second word line;
- receiving, by the TCAM, a second search criteria;
- performing, by the TCAM, a first search of the first and second storage portion using the first compare port with the first search criteria;
- performing, by the TCAM, a second search of the first and second storage portion using the second compare port with the second search criteria;
- determining, by the TCAM, a first search output for the first search criteria; and
- determining, by the TCAM, a second search output for the second search criteria.

10. The method of claim 9, comprising:
prior to performing the first and second search by the TCAM, charging the first and second match lines to a high voltage.

11. The method of claim 9, comprising:
prior to performing the first and second search by the TCAM, charging the first and second search lines to ground.

12. The method of claim 10, comprising:
- determining, by the TCAM, whether the first match line has been pulled down to a lower voltage than the charged high voltage; and
- determining, by the TCAM, whether the second match line has been pulled down to a lower voltage than the charged high voltage.

13. The method of claim 9, wherein the first search and second search are performed concurrently during a single computer processing unit (CPU) clock cycle.

* * * * *